United States Patent
Yamane

(10) Patent No.: US 9,324,903 B2
(45) Date of Patent: Apr. 26, 2016

(54) MULTIPLE QUANTUM WELL SEMICONDUCTOR LIGHT EMITTING ELEMENT

(71) Applicant: STANLEY ELECTRIC CO., LTD., Meguro-ku, Tokyo (JP)

(72) Inventor: Takayoshi Yamane, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/538,559

(22) Filed: Nov. 11, 2014

(65) Prior Publication Data
US 2015/0129835 A1    May 14, 2015

(30) Foreign Application Priority Data

Nov. 13, 2013 (JP) .................................. 2013-235186
Nov. 6, 2014 (JP) .................................. 2014-225769

(51) Int. Cl.
| | |
|---|---|
| H01L 29/06 | (2006.01) |
| H01L 31/00 | (2006.01) |
| H01L 33/00 | (2010.01) |
| H01L 33/06 | (2010.01) |
| H01S 5/343 | (2006.01) |
| H01L 33/32 | (2010.01) |

(52) U.S. Cl.
CPC ............ *H01L 33/0025* (2013.01); *H01L 33/06* (2013.01); *H01S 5/34333* (2013.01); *H01L 33/325* (2013.01)

(58) Field of Classification Search
None
See application file for complete search history.

(56) References Cited

U.S. PATENT DOCUMENTS

| | | | |
|---|---|---|---|
| 7,554,122 B2 | 6/2009 | Kyono et al. | |
| 2004/0056258 A1 | 3/2004 | Tadatomo et al. | |
| 2013/0043457 A1* | 2/2013 | Kang et al. | 257/13 |

FOREIGN PATENT DOCUMENTS

| | | |
|---|---|---|
| JP | 10242512 A | 9/1998 |
| JP | 2002176198 A | 6/2002 |
| JP | 4161603 B2 | 10/2008 |
| JP | 4206086 B2 | 1/2009 |
| JP | 4441563 B2 | 3/2010 |

* cited by examiner

*Primary Examiner* — Calvin Choi
(74) *Attorney, Agent, or Firm* — Holtz, Holtz & Volek PC

(57) ABSTRACT

A semiconductor light emitting element includes: an n-type semiconductor layer; a super lattice structure layer formed on the n-type semiconductor layer and including repeatedly-formed first semiconductor layers and second semiconductor layers having a composition with a band gap greater than that of the first semiconductor layer; an electron injection control layer including a first control layer formed on the second semiconductor layer of super lattice structure layer and a second control layer formed on the first control layer; and an MQW light emitting layer formed on the second control layer and including repeatedly-formed barrier layers and quantum well layers. The first control layer has a composition with a band gap smaller than that of the second semiconductor layer of super lattice structure layer. The second control layer has a composition and a thickness same as or smaller than those of the quantum well layer of the MQW light emitting layer.

8 Claims, 5 Drawing Sheets

MULTIPLE QUANTUM WELL SEMICONDUCTOR LIGHT EMITTING ELEMENT

BACKGROUND OF THE INVENTION

1. Field of the Invention

The present invention relates to a semiconductor light emitting element having a light emitting layer with a multiple quantum well (MQW) structure. In particular, the present invention relates to a light emitting diode (LED) having an MQW light emitting layer.

2. Description of the Related Art

It has been known that the MQW structure can be employed in a light emitting layer in order to improve light emission characteristics such as light emission efficiency in a semiconductor light emitting element such as an LED or a semiconductor laser.

Patent documents such as Japanese Patent Application Laid-Open No. Hei. 10-242512, Japanese Patent No. 4441563, Japanese Patent No. 4206086, Japanese Patent No. 4161603, and Japanese Patent Application Laid-Open No. 2002-176198 disclose various structures such as MQW layers or guide layers for improving light emission characteristics.

SUMMARY OF THE INVENTION

LEDs using nitride semiconductors, for example, are being utilized in various fields. Among such applications, some (e.g., a lamp for an automobile) are expected to be used under environments severer than those of a typical LED used for room lighting or the like. Specifically, there is a need for light emission characteristics achieving excellent temperature characteristics at a high temperature (about 70° C.), which are by no means inferior to those at a room temperature.

In general, when an operating temperature of a semiconductor light emitting element such as an LED is increased, a light emission output thereof is reduced. Such a reduction in light emission output is caused by a reduction in recombination efficiency between electrons and holes due to the overflow of carriers, an increased probability of carrier trapping due to defects in crystals, a reduced carrier injection efficiency, and the like.

There is a need for a semiconductor light emitting element capable of suppressing a reduction in the light emission efficiency thereof due to such physical phenomena and therefore maintaining the high light emission efficiency and also capable of achieving excellent temperature characteristics, i.e., the light emission efficiency and light emission output thereof being less likely to decrease even during a high-temperature operation thereof.

The present invention relates to a semiconductor light emitting element such as an LED or LD (laser diode) with the use of an MQW light emitting layer. It is an object of the present invention to provide a semiconductor light emitting element which can suppress the overflow of carriers and thus have a high carrier injection efficiency into the light emitting layer and which has a high light emission efficiency and excellent temperature characteristics.

A semiconductor light emitting element according to the present invention includes:

an n-type semiconductor layer;

a super lattice structure layer formed on the n-type semiconductor layer and including repeatedly-formed first semiconductor layers and second semiconductor layers having a composition with a band gap larger than that of the first semiconductor layer;

an electron injection control layer including a first control layer formed on the second semiconductor layer of the super lattice structure layer and a second control layer formed on the first control layer; and an MQW light emitting layer formed on the second control layer and including repeatedly-formed barrier layers and quantum well layers, wherein the first control layer has a composition with a band gap smaller than that of the second semiconductor layer of the super lattice structure layer and the second control layer has a composition and a layer thickness same as those of the quantum well layer of the MQW light emitting layer or, alternatively the second control layer has a composition with a band gap smaller than that of the quantum well layer of the MQW light emitting layer and a layer thickness thinner than that of the quantum well layer of the MQW light emitting layer.

BRIEF DESCRIPTION OF THE DRAWINGS

The aforementioned aspects and other features of the present invention are explained in the following description, taken in connection with the accompanying drawing figures wherein.

DETAILED DESCRIPTION OF THE INVENTION

Figure 1:
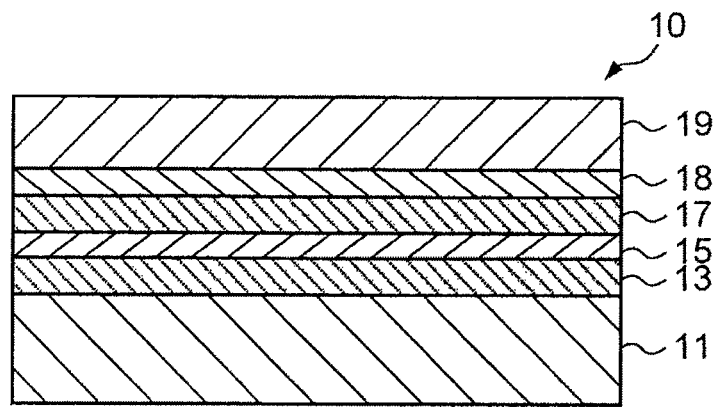
FIG. 1 is a cross-sectional view schematically illustrating a structure of a semiconductor structure layer 10 according to an embodiment of the present invention.

An LED having a light emitting layer with an MQW structure according to the present invention will now be described below. Although preferred embodiments of the present invention will be described, these embodiments may be appropriately modified or combined one another. Also, in the following description and the accompanying drawings, substantially the same or equivalent elements will be denoted by the same reference numerals.

In general, when an operating temperature of a semiconductor light emitting element such as an LED is increased, a light emission output thereof is decreased. Several reasons therefor can be considered: (i) a reduction in recombination efficiency between electrons and holes due to an increased probability that electrons, which are carriers, overflow into a p-type region; (ii) a reduction in the number of carriers contributing to light emission due to an increased probability that the carriers are trapped in defects in crystals; (iii) a change in injection efficiency of carriers as compared with that during a room temperature operation of the semiconductor light emitting element, etc. It can be considered that the reason (i), in particular, accounts for a large proportion thereamong.

Factors of (i) will be discussed next more deeply. It has been generally known that a concentration of carriers in a semiconductor is increased when a temperature is increased. More specifically, the number of electrons, which are carriers, is increased in an n-type semiconductor whereas the number of holes is increased in a p-type semiconductor. While such increased respective carriers are flowed into a light emitting layer, an amount thereof passing the light emitting layer is also increased due to the increase in the number of carriers. This phenomenon is prominent especially in electrons having a small effective mass and it can be considered that this leads to an electron overflow phenomenon. In other words, if the carriers increased as a result of a temperature increase can be efficiently guided into the light emitting layer, the overflow phenomenon can be reduced. Consequently, the temperature characteristics thereof can be improved. In addition, since more carriers can be guided into the light emitting layer, it can be considered that the light emission efficiency thereof can also be increased. Based on such ideas, the present inventor has found out a structure capable of simultaneously improving temperature characteristics and light emission efficiency.

FIG. 1 is a cross-sectional view schematically illustrating a structure of a semiconductor structure layer 10 in a light emitting element of the present invention. As shown in FIG. 1, the semiconductor structure layer 10 has a structure including: an n-type semiconductor layer 11; a super lattice structure (SLS) layer 13; an electron injection control layer 15; a light emitting layer 17 having an MQW structure; an electron block (EBL) layer 18; and a p-type semiconductor layer 19 sequentially layered in this order.

Figure 2:
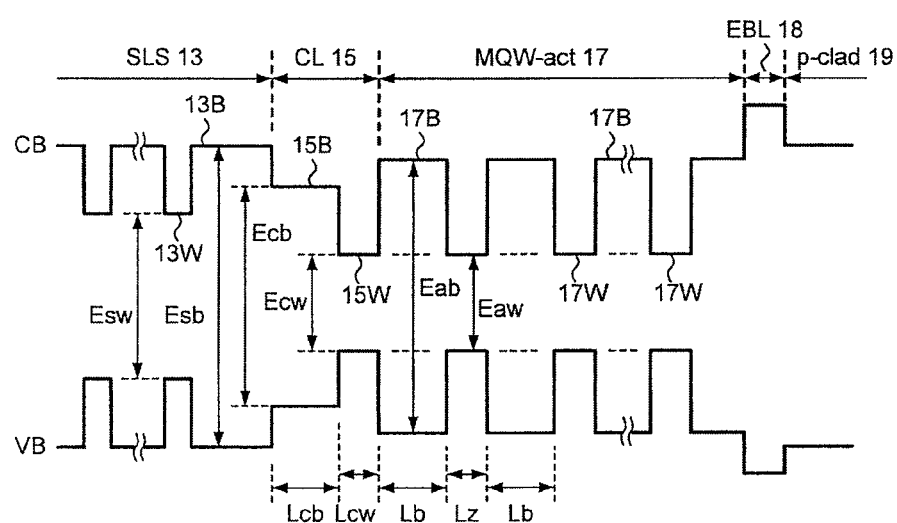
FIG. 2 is a band diagram schematically illustrating a band structure of the semiconductor structure layer 10.

FIG. 2 is a band diagram schematically illustrating a band structure of the semiconductor structure layer 10. CB denotes a conduction band and VB denotes a valence band. Referring to FIG. 2, band structures of the SLS layer 13, the electron injection control layer 15, and the MQW light emitting layer 17 will be described in detail.

Note that the band gap of a semiconductor layer in the present specification refers to the band gap of the semiconductor crystal with the composition of the semiconductor layer, i.e., the band gap of a semiconductor layer having a layer thickness in a level incapable of causing a quantum effect (what is called a bulk). Thus, with regard to a semiconductor layer having a layer thickness in a level capable of causing a quantum effect, the band gap of such a semiconductor layer is different from energy between quantum levels in such a semiconductor layer.

The SLS layer 13 has a super lattice structure in which a first semiconductor layer 13W (band gap: Esw) and a second semiconductor layer 13B having a composition with a band gap (Esb) larger than that of the first semiconductor layer 13W are repeatedly formed. Note that the SLS layer 13 is terminated with the second semiconductor layer 13B.

The electron injection control layer (CL) 15 including a first control layer 15B and a second control layer 15W is formed on the second semiconductor layer 13B which is the last layer in the SLS layer 13. More specifically, the first control layer 15B has a composition (band gap: Ecb) with a band gap smaller than that of the second semiconductor layer 13B (band gap: Esb) of the SLS layer 13 and has a layer thickness Lcb. The second control layer 15W (layer thickness Lcw) is formed on the first control layer 15B.

The MQW light emitting layer 17 in which a barrier layer 17B and a quantum well layer 17W are repeatedly formed is formed on the second control layer 15W of the electron injection control layer 15. The respective barrier layers 17B in the MQW light emitting layer (MQW-act) 17 have the same composition (band gap: Eab) and the same layer thickness (Lb). The respective quantum well layers 17W have the same composition (band gap: Eaw) and the same layer thickness (Lz). The composition (band gap: Ecw) of the second control layer 15W of the electron injection control layer 15 described above is the same as the composition of the quantum well layer 17W of the MQW light emitting layer 17 (i.e., Ecw=Eaw). The second control layer 15W has the same layer thickness as the quantum well layer 17W (layer thickness Lcw=Lz). Further the composition of the second control layer 15W of the electron injection control layer 15 may be configured to have a band gap smaller than that of the quantum well layer 17W of the MQW light emitting layer 17, and the second control layer 15W may be configured to have a layer thickness thinner than that of the quantum well layer 17W of the MQW light emitting layer 17. Even in this case, the electron injection control layer 15 is able to keep a function for injecting electrons therefrom into the quantum well layer 17W.

The electron injection control layer 15 functions as a layer for controlling injection efficiency of electrons injected from the SLS layer 13 into the MQW light emitting layer 17, i.e., suppressing or promoting electron injection. More specifically, the electron injection control layer 15 decelerates the electrons injected from the SLS layer 13, thereby suppressing the overflow of the electrons and thus improving the injection efficiency of the electrons into the respective quantum well layers 17W of the MQW light emitting layer 17.

Example 1

Example 1 of the present invention will now be described below. Although a case where a semiconductor structure layer 10 as Example 1 is made of a GaN (gallium nitride)-based semiconductor will be described, the crystal system thereof is not limited thereto. More specifically, an LED was manufactured with the use of the semiconductor structure layer 10 and the light emission characteristics thereof were evaluated.

A circular sapphire monocrystalline substrate having a diameter of 2 inches and having a c-plane as the front surface thereof was employed as a crystal growth substrate. The semiconductor structure layer 10, which is an LED structure layer, was grown on the substrate by metal organic chemical vapor deposition (MOCVD).

After growing a low-temperature GaN buffer layer, the semiconductor structure layer 10 was grown thereon. The semiconductor structure layer 10 has a structure including an n-GaN layer 11, an SLS layer 13, an electron injection control layer 15, an MQW light emitting layer 17, and a p-GaN layer 19 sequentially layered in this order.

The SLS layer 13 has an InGaN/GaN super lattice structure in which an $In_xGa_{1-x}N$ layer 13W and a GaN layer 13B are repeatedly formed in an alternate manner.

An $In_{y1}Ga_{1-y1}N$ layer (first control layer) 15B is formed on the GaN layer 13B which is the last layer of the SLS layer 13 and an $In_{y2}Ga_{1-y2}N$ layer (second control layer) 15W is formed on the $In_{y1}Ga_{1-y1}N$ layer 15B ($0<y1<y2<1$). The first control layer 15B and the second control layer 15W together form the electron injection control layer (hereinafter also referred to simply as a control layer CL) 15.

More specifically, the $In_{y1}Ga_{1-y1}N$ layer 15B, which is the first control layer (barrier layer) of the electron injection control layer (CL) 15, has a composition (band gap: Ecb) with a band gap smaller than the band gap (Esb) of the GaN layer 13B, which is the last layer of the SLS layer 13. Moreover, the $In_{y1}Ga_{1-y1}N$ layer 15B has the layer thickness Lcb and the $In_{y2}Ga_{1-y2}N$ layer 15W has the layer thickness Lcw.

A barrier layer 17B of the MQW light emitting layer 17 is formed on the $In_{y2}Ga_{1-y2}N$ layer 15W, which is the second control layer (well layer) of the electron injection control layer 15, and a quantum well layer 17W is formed on the barrier layer 17B. These barrier layer 17B and quantum well layer 17W are repeatedly formed to configure the MQW light emitting layer 17. The barrier layer 17B is an $In_{z1}Ga_{1-z1}N$ layer and the quantum well layer 17W is an $In_{z2}Ga_{1-z2}N$ layer ($0 \leq z1 < z2 < 1$). In the MQW light emitting layer 17, the barrier layers 17B have the same composition and the same layer thickness (Lb), and the quantum well layers 17W have the same composition and the same layer thickness (Lz).

The composition of the $In_{y2}Ga_{1-y2}N$ layer 15W of the electron injection control layer 15 described above (In composition=y2) is set so as to have the same as the composition of the $In_{z2}Ga_{1-z2}N$ layer 17W which is the quantum well layer of the MQW light emitting layer 17 (i.e., y2=z2) and have the same layer thickness as the quantum well layer 17W (layer thickness Lcw=Lz).

The electron injection control layer 15 functions as a layer for controlling injection efficiency of electrons injected from the SLS layer 13 into the MQW light emitting layer 17. More specifically, the SLS layer 13 decelerates the electrons injected from the n-GaN layer 11 and the electron injection control layer 15 further decelerates the electrons injected from the SLS layer 13, thereby suppressing the overflow of the electrons and thus improving the injection efficiency of the electrons into the respective quantum well layers 17W of the MQW light emitting layer 17.

More specifically, a GaN barrier layer is employed as the last layer of the SLS layer 13. This is because the SLS layer 13 serves to not only alleviate lattice mismatch between the n-GaN layer 11 and the MQW light emitting layer 17 but also decelerate the electrons flowed thereto from the n-GaN layer 11 and promote current diffusion in a crystal in-plane direction. This also allows for an efficient development of an effect of carrier (electron) injection control. Note that the SLS layer 13 may be n-type doped or undoped. In the present example, no doping is applied to the SLS layer 13.

The electron injection control layer 15 may be undoped or n-type doped. In the present example, the $In_{y1}Ga_{1-y1}N$ layer 15B, which is the first control layer, was doped with a concentration of $3 \times 10^{18}$ cm$^{-3}$ and the $In_{y2}Ga_{1-y2}N$ layer 15W, which is the second control layer, was undoped. Also, the effect of electron injection control was examined while varying the In composition (y1) or layer thickness of the $In_{y1}Ga_{1-y1}N$ layer 15B. Note that the composition of the $In_{y2}Ga_{1-y2}N$ layer 15W was set to be the same as that of the quantum well layer 17W of the MQW light emitting layer 17 (i.e., y2=z2) and the layer thickness thereof was set to be the same as that of the quantum well layer 17W (layer thickness Lcw=Lz) as described above.

The layer thickness of the quantum well layer 17W in the MQW light emitting layer 17 was set at 4 nm (nanometers) and the layer thickness of the barrier layer 17B was set at 6 nm. The MQW light emitting layer 17 had nine-layered quantum well layers 17W and the barrier layer 173 was provided as the last layer thereof. The In composition of the quantum well layer ($In_{z2}Ga_{1-z2}N$ layer) 17W was adjusted so as to obtain a light emission wavelength of 450 nm. It is desirable to apply doping to the MQW light emitting layer 17. In the present example, doping was appropriately applied to the MQW. The doping amount is about $1 \times 10^{18}$ to $3 \times 10^{19}$ cm$^{-3}$.

An electron block (EBL) layer 18 (with a layer thickness of 15 nm) was then formed on the barrier layer 17B, which is the last layer of the MQW light emitting layer 17. The p-GaN layer (p-clad layer) 19 was formed on the electron block (EBL) layer 18. Note that a p-GaN layer (not shown) functioning as a contact layer was formed on the p-GaN layer 19.

Finally, an n-electrode and a p-electrode were formed in the n-GaN layer 11 and the p-GaN layer 19, respectively, thereby completing an LED element.

(Evaluation Results)

The temperature characteristic evaluation on light outputs of the above-described LED element was performed. Specifically, LED element samples were manufactured while varying the In composition (y1) and layer thickness of the first control layer ($In_{y1}Ga_{1-y1}N$ layer) 15B of the electron injection control layer 15. Next, the characteristic evaluation of the LED elements was performed by comparing luminances (light outputs) thereof with one another when the operating temperature thereof was varied and a constant current was applied thereto. More specifically, the LED element was placed on a Peltier element. The light outputs of the LED element were measured with a temperature thereof being kept at 25° C. and 70° C. and the temperature characteristics thereof were evaluated.

Figure 3:
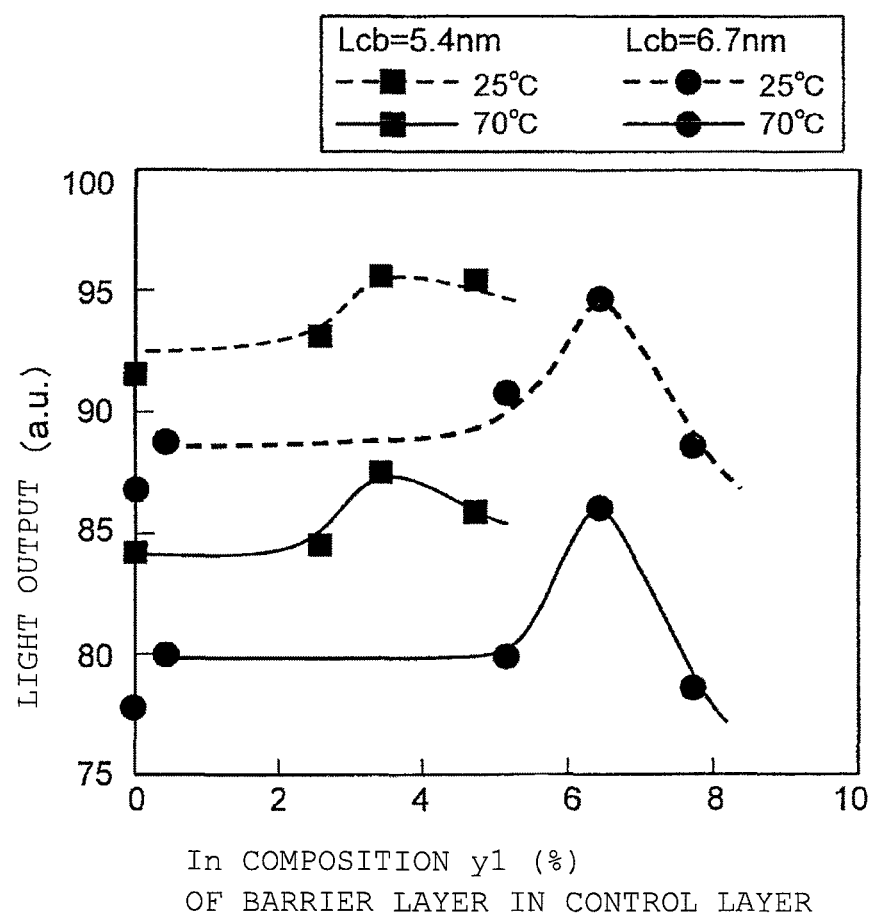
FIG. 3 is a graph plotting temperature characteristics of light outputs relative to In compositions y1 of a first control layer when a layer thickness Lcb of the first control layer ($In_{y1}Ga_{1-y1}N$ layer) 15B is set at 5.4 nm and 6.7 nm.

FIG. 3 is a graph plotting the temperature characteristics of light outputs when the layer thickness Lcb of the first control layer ($In_{y1}Ga_{1-y1}N$ layer) 15B was set at 5.4 nm and 6.7 nm and the In composition (y1) of the first control layer ($In_{y1}Ga_{1-y1}N$ layer) 15B was varied in a range of 0 to 8% (y1=0 to 0.08). Note that the light outputs are shown with a normalized arbitrary unit (a.u.).

Referring to FIG. 3, as a general trend, when the operating temperature is increased from 25° C. to 70° C., the light output is decreased. This suggests that the number of carriers in the semiconductor has been increased due to the temperature increase and thus the overflow phenomenon of the carriers (electrons) has become prominent.

(In Composition and Layer Thickness of First Control Layer)

First, when the In composition of the first control layer ($In_{y1}Ga_{1-y1}N$ layer) 15B is 0 (y1=0), i.e., when the In composition of the first control layer 15B is the same as the composition of the GaN barrier layer which is the last layer of the SLS layer 13, it can be seen that the light output is low as compared with a case when In composition y1>0. The main reason for this can be considered that the carrier overflow causes a low level of electron injection into the quantum well layers 17W in the MQW light emitting layer 17 positioned closer to the electron injection control layer 15 and thus results in a small contribution to light emission.

If the In composition (y1) of the first control layer ($In_{y1}Ga_{1-y1}N$ layer) 15B is being increased, in contrast, the light output is gradually increased. When the layer thickness Lcb of the first control layer ($In_{y1}Ga_{1-y1}N$ layer) 15B is 5.4 nm, the light output reaches its maximum when the In composition is at 3.5% (y1=0.035). When the layer thickness Lcb is 6.7 nm, the light output reaches its maximum when the In composition is at 6.4% (y1=0.064). This corresponds to a 15% light output increase as compared with the case when the In composition of the first control layer 15B is 0 (y1=0), i.e., when the In composition of the first control layer 15B is the same as the composition of the GaN barrier layer which is the last layer of the SLS layer 13. When the In composition y1 exceeds its optimum value at which the light output reaches its maximum, the light output is gradually decreased. The reason for this can be considered that the quantum well layers 17W positioned closer to the electron injection control layer 15 are in an electron-excessive state and electron injection into the quantum well layers 17W positioned farther away from the electron injection control layer 15 is correspondingly decreased when the In composition exceeds the optimum zone.

Figure 4A:
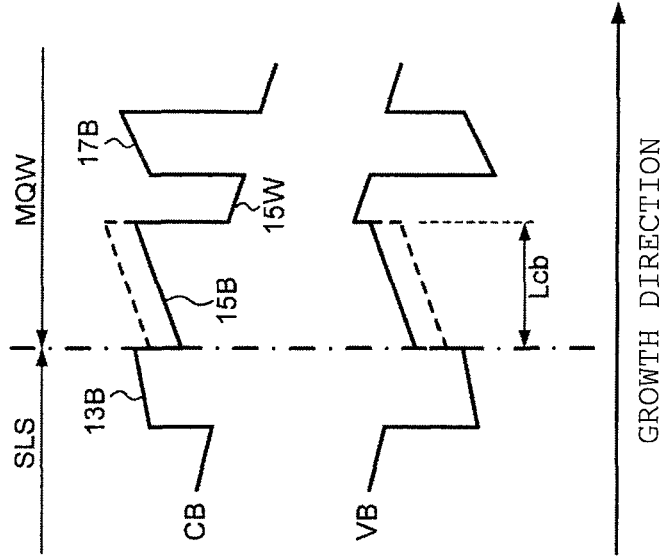
FIGS. 4A and 4B are schematic views of band diagrams illustrating cases where the layer thickness Lcb of the first control layer ($In_{y1}Ga_{1-y1}N$ layer) 15B is small and large, respectively.
Figure 4B:
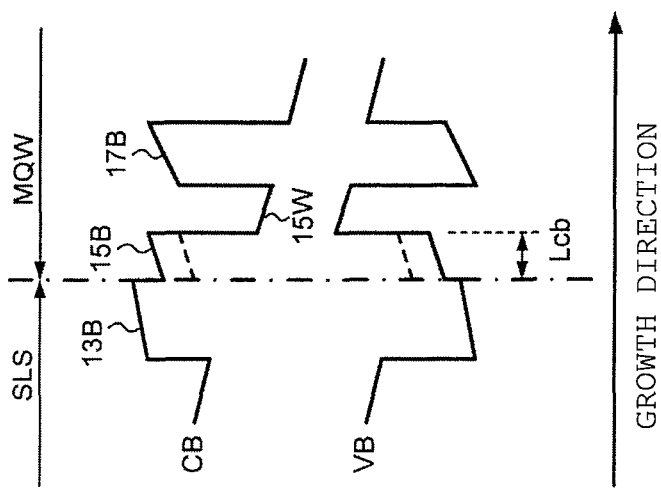

The optimum zone of the In composition y1 is varied depending on the layer thickness Lcb of the first control layer ($In_{y1}Ga_{1-y1}N$ layer) 15B. This will be described with reference to FIGS. 4A and 4B. FIGS. 4A and 4B are schematic views of band diagrams illustrating cases where the layer thickness Lcb of the first control layer ($In_{y1}Ga_{1-y1}N$ layer) 15B is small and large, respectively.

(i) Case where Layer Thickness Lcb of First Control Layer 15B is Small (FIG. 4A)

In this case, it is preferable that the In composition y1 of the first control layer 15B be relatively small. In other words, it is preferable that the band gap be large. The reason for this is as follows. When the In composition is large (shown with a broken line in the figure, for example), the function of guiding electrons from the electron injection control layer 15 to the MQW light emitting layer 17 is intensified. Consequently, the second control layer (well layer: $In_{y2}Ga_{1-y2}N$ layer) 15W of the electron injection control layer 15 and the quantum well layers 17W positioned closer to the electron injection control layer 15 among the well layers in the MQW light emitting layer 17 are easily filled with the electrons. On the other hand, the function of guiding electrons to the quantum well layers 17W positioned farther away from the electron injection control layer 15 is weakened. Specifically, when the layer thickness of the first control layer 15B is 6 nm or smaller, a preferable In composition is about 1 to 6%. A more preferable In composition is about 2 to 5%.

(ii) Case where Layer Thickness Lcb of First Control Layer 15B is Large (FIG. 4B)

In this case, it is preferable that the In composition y1 of the first control layer 15B be relatively large. In other words, it is preferable that the band gap be small. This is because when the In composition is small (shown with a broken line in the figure, for example), an energy potential is high near the second control layer 15W of the electron injection control layer 15 and thus carriers (electrons) cannot be efficiently guided to the second control layer 15W and the quantum well layers 17W positioned closer to the electron injection control layer 15. Specifically, when the layer thickness Lcb of the first control layer 15B is about 6 to 12 nm, a preferable In composition is about 4 to 12%. A more preferable In composition is about 5 to 8%.

(Temperature Characteristics)

Figure 5:
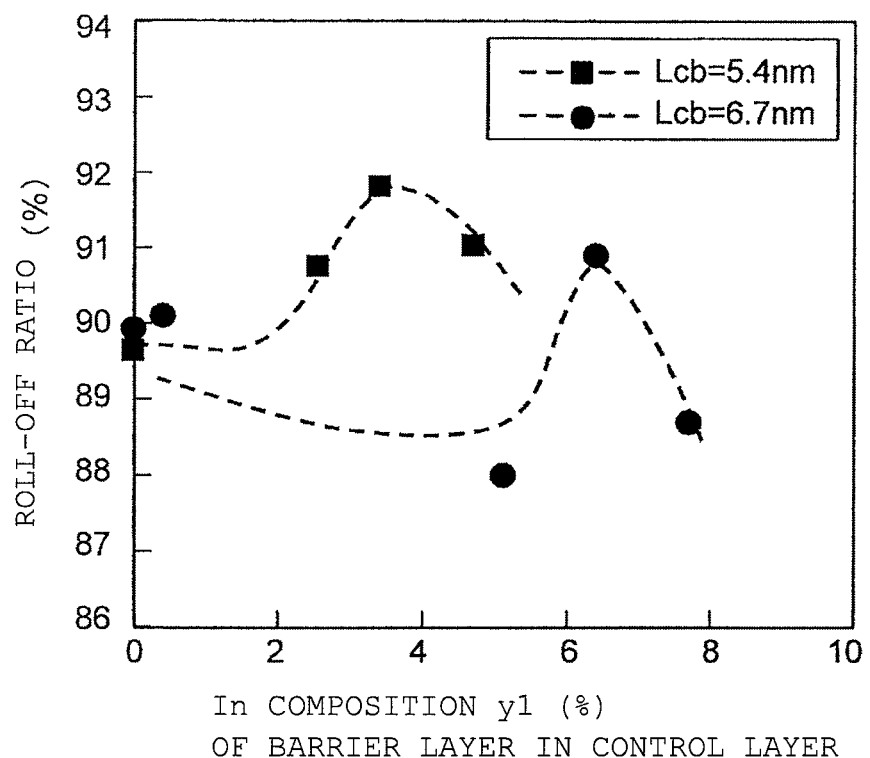
FIG. 5 is a graph showing a roll-off ratio (%) of light outputs relative to an In composition y1 of the first control layer ($In_{y1}Ga_{1-y1}N$ layer) 15B.

Results obtained when the operating temperature is increased to 70° C. will be discussed next. While the light emission efficiencies of the LED elements are reduced when the operating temperature thereof is increased, there is a difference between reduction levels thereof. FIG. 5 shows a roll-off ratio (%) of light outputs relative to an In composition y1 of the first control layer ($In_{y1}Ga_{1-y1}N$ layer) 15B. Here, the roll-off ratio RO (%) is represented by RO (%)=Po (70° C.)/Po (25° C.)×100% wherein Po (25° C.) and Po (70° C.) denote light outputs when the operating temperature is at 25° C. and 70° C., respectively. Specifically, a higher roll-off ratio RO (%) indicates a lower level of light output reduction at a high temperature.

From FIG. 5, when the layer thickness Lcb of the first control layer 15B is 6.7 nm, the roll-off ratio RO is at 91% when the In composition y1 is at 6.4%. This shows that the region of the In composition at which the roll-off ratio RO reaches its maximum coincides with the region at which the light output reaches its maximum (FIG. 3).

When the In composition y1 is extremely small (e.g., 1% or less), the temperature characteristics appear to be relatively favorable. While the roll-off ratio RO (%) is gently reduced along with an increase in the composition, the best temperature characteristics are obtained while in the optimum region (zone) and thereafter the temperature characteristics are decreased again. While the temperature characteristics appear to be relatively favorable in the region where the In composition y1 is extremely small, the light outputs are low in this region as shown in FIG. 3. Therefore, from the standpoint of the simultaneous improvements in light emission efficiency (light output) and temperature characteristics, such a region cannot be regarded as a favorable region.

According to these results, with regard to the temperature characteristics, the LED element having the electron injection control layer 15 (first control layer 15B) with the In composition in the optimum zone has a superiority by 1.1% over a case without the electron injection control layer 15 and by 3.3% over a case when the electron injection control layer 15 is provided but the In composition thereof falls outside the optimum zone.

In other words, it can be considered that the electron injection control layer 15 is effectively functioned and the overflow phenomenon of carriers (electrons) is thereby reduced by controlling the In composition of the first control layer 15B within the optimum zone. Also, when a temperature is increased, not only electrons but also holes are increased. Thus, the amount of holes injected up to the quantum well layers 17W positioned closer to the electron injection control layer 15 (farther away from the p-type semiconductor layer) among the well layers in the MQW light emitting layer 17 is increased. This can be considered also as a factor for suppressing deterioration in light emission efficiency during the high-temperature operation.

From the above, in combination with the results about the light output characteristics (FIG. 3), it has been found out that improvements in light emission output and in temperature characteristics can be simultaneously achieved by controlling the In composition of the first control layer 15B in the electron injection control layer 15.

From these viewpoints, the In composition of the first control layer is preferably in a range of 2 to 10% and the layer thickness is preferably 10 nm or smaller.

When the layer thickness Lcb of the first control layer 15B is larger than the layer thickness Lb of the barrier layer 17B in the MQW light emitting layer 17 (Lcb>Lb), it is preferable that the In composition y1 of the first control layer 15B be greater than the In composition z1 of the barrier layer 17B in the MQW light emitting layer 17 (y1>z1), i.e., the band gap of the first control layer 15B be smaller than the band gap of the barrier layer 17B in the MQW light emitting layer 17.

(Mechanism for Improving Light Emission Efficiency and Temperature Characteristics)

A light emission efficiency is rate-controlled by a balance between amounts of electrons and holes injected into the quantum well layers 17W (first half portion) positioned closer to the n-type semiconductor layer (the n-GaN layer 11, the SLS layer 13) among the well layers in the MQW light emitting layer 17. Since the effective mass of a hole is greater than that of an electron, the amount of holes present in the quantum well layers 17W positioned closer to the n-type semiconductor layer (the first half portion of the MQW light emitting layer 17) can be regarded as constant.

(i) When the In composition of the first control layer 15B is zero, the electrons coming from the n-type semiconductor layer are not efficiently trapped by the quantum well layers 17W in the first half portion. Consequently, the light emission efficiency from the quantum well layers 17W in the first half portion is low and the light output thereof is therefore small.

(ii) Along with an increase in the In composition, the effect of guiding electrons into the quantum well layers 17W in the first half portion is being strengthened, thereby increasing the amount of light emission from the quantum well layers 17W in the first half portion. Consequently, the light emission efficiency of the MQW light emitting layer 17 as a whole is improved.

(iii) Beyond the optimum In composition zone, the quantum well layers 17W in the first half portion of the MQW light emitting layer 17 are in an electron-excessive state. In such a state, the amount of holes having been injected into the quantum well layers 17W in the first half portion becomes insufficient and the electrons thus excessively exist over the holes. Consequently, electron injection into the quantum well layers 17W positioned farther away from the n-type semiconductor layer (the latter half portion of the MQW light emitting layer 17) among the well layers in the MQW light emitting layer 17 is correspondingly decreased, thereby resulting in a lowered light emission efficiency.

While the temperature characteristics can be understood intuitively from the band diagram (FIG. 2), the electrons flowed from the n-type semiconductor layer can be efficiently guided into the second control layer 15W and the quantum well layers 17W by providing, on the GaN barrier layer which is the last layer of the SLS layer 13, the InGaN layer having a band gap smaller than that of the GaN barrier layer. Consequently, the proportion of electrons contributing to the overflow is reduced, thereby reducing the overflow phenomenon. As a result, the light emission efficiency becomes less likely to decrease even during the high-temperature operation, thus improving the temperature characteristics.

(SLS Layer)

(i) Reason why Electron Injection Control Layer 15 is Directly Provided on SLS Layer 13

The InGaN/GaN multilayer in the SLS layer 13 serves to decelerate the electrons flowed from the n-type semiconductor layer (n-GaN layer 11). As the InGaN/GaN multilayer is used as an electron diffusion layer, the InGaN/GaN multilayer has a function of suppressing the flow of electrons in a direction perpendicular to the multilayer. If a layered structure of n-GaN layer/electron injection control layer/MQW light emitting layer without the SLS layer is employed, the flow of electrons from the n-GaN layer is strong, thereby making it difficult to exhibit the effect of guiding the electrons into the quantum well layers 17W positioned closer to the electron injection control layer 15 among the quantum well layers in the MQW light emitting layer.

(ii) Reason why Last Layer of SLS Layer 13 is Barrier Layer

From the standpoint of crystal growth, the barrier layer (GaN) is generally employed as the last layer of the SLS layer. This is because when the SLS layer is ended with InGaN, In is escaped from the surface thereof due to its high growth temperature while obtaining the growth temperature of the MQW light emitting layer and thus the crystallinity thereof cannot be maintained. If a case where a structure connecting the SLS well layer with the electron injection control layer is achieved is mentioned while ignoring the aforementioned problem, the following two cases can be assumed.

Figure 6A:
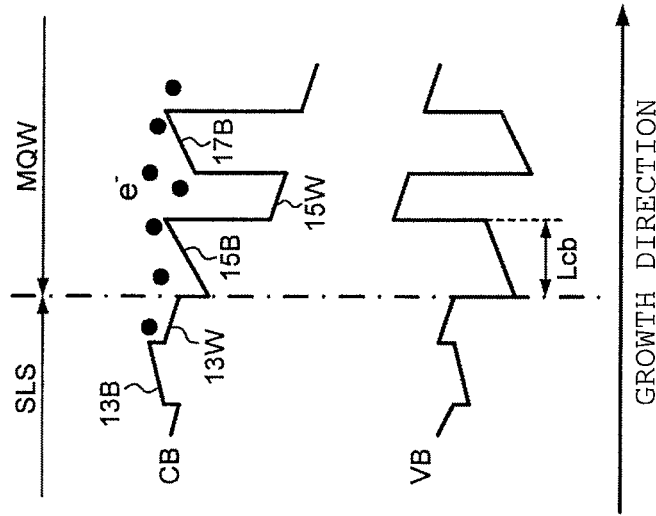
FIGS. 6A and 6B are schematic views of band diagrams illustrating cases where the last layer of an SLS layer 13 is a well layer 13W and In compositions thereof are greater than and smaller than the In composition of the first control layer 15B, respectively.

FIG. 6A is a schematic view of a band diagram illustrating a case where the last layer of the SLS layer 13 is the well layer 13W and the In composition thereof is greater than the In composition of the first control layer 15B. In this case, electrons are accumulated between the SLS well layer 13W and the first control layer 15B, thereby weakening the function of guiding electrons into the quantum well layer of the MQW light emitting layer. In this case, while the overflow phenomenon can be suppressed, the light emission efficiency is reduced since non-light-emitting carriers are increased. This phenomenon fails to satisfy the function of maintaining or improving the light emission efficiency by guiding electrons contributing to light emission into the quantum well layers in the first half portion of the MQW light emitting layer and also improving the temperature characteristics by suppressing the overflow phenomenon. The same thing applies to a case where an InGaN thick film having an In composition greater than that of the first control layer 15B is employed instead of the SLS.

Figure 6B:
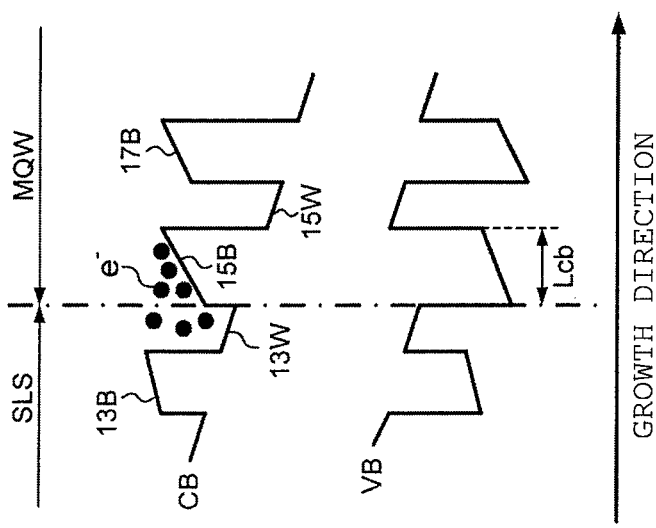

FIG. 6B is a schematic view of a band diagram illustrating a case where the last layer of the SLS layer 13 is the well layer 13W and the In composition thereof is smaller than the In composition of the first control layer 15B. The range of the In composition satisfying such conditions is very narrow. More specifically, this corresponds to when the In composition of the well layer 13W in the SLS layer 13 is about 1 to 8% and the In composition of the first control layer 15B is greater than such a range. Under such conditions, an energy difference between the well layer of the SLS layer 13 and the barrier layer is small and the function of decelerating the electrons from the n-GaN layer 11 is therefore small. In other words, the effect of guiding the electrons into the quantum well layers in the MQW light emitting layer is no longer exhibited. Consequently, the overflow phenomenon cannot be suppressed and the effect of improving the temperature characteristics cannot be therefore obtained.

As described above, it has been found out that the overflow of electrons can be suppressed and electron injection into the second control layer of the electron injection control layer and the MQW light emitting layer can be adjusted by adjusting the composition (band gap) of the first control layer of the electron injection control layer formed on the barrier layer of the super lattice structure layer. Thus, it has been found out that a high light emission efficiency and improved temperature characteristics can thereby be obtained.

Although the present invention has been described taking an LED as an example, the present invention can also be applied to other semiconductor light emitting elements. In other words, the present invention can also be applied to a light emitting element configured to include a light emitting layer formed from a multiple quantum well layer. Although the case where the semiconductor structure layer 10 is made of a GaN (gallium nitride)-based semiconductor has been described, the crystal system thereof is not limited thereto. The numerical values and materials in the above-described embodiments, e.g., the composition and layer thickness of the semiconductor layer, the number of the well layers in the MQW light emitting layer, the light emission wavelength, the materials of the conductor and the metal layer, the layer thicknesses, etc., have been described by way of example only and can be appropriately changed. Moreover, the above-described embodiments may be appropriately modified and combined with one another.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed embodiments but may be practiced within the full scope of the appended claims.

This application is based upon and claims the benefit of priority from the prior Japanese Patent Application Nos. 2013-235186 and 2014-225769, filed Nov. 13, 2013 and Nov. 6, 2014 respectively, the entire contents of which are incorporated herein by reference.

What is claimed is:

1. A semiconductor light emitting element comprising:
   an n-type semiconductor layer;
   a super lattice structure layer formed over and in direct contact with the n-type semiconductor layer and including repeatedly-formed first semiconductor layers and second semiconductor layers, wherein each second semiconductor layer has a composition with a band gap larger than that of each first semiconductor layer;
   an electron injection control layer including a first control layer formed over and in direct contact with a second semiconductor layer of the super lattice structure layer and a second control layer formed over and in direct contact with the first control layer; and
   an MQW light emitting layer formed over and in direct contact with the second control layer and including repeatedly-formed barrier layers and quantum well layers,
   wherein the first control layer has a composition with a band gap smaller than that of the second semiconductor layer of the super lattice structure layer, and
   wherein the second control layer has one of: (i) a composition and a layer thickness same as those of the quantum well layers of the MQW light emitting layer, and (ii) a composition with a band gap smaller than that of the quantum well layers of the MQW light emitting layer and a layer thickness thinner than that of the quantum well layers of the MQW light emitting layer.

2. The semiconductor light emitting element according to claim 1, wherein the first control layer has the composition with the band gap smaller than that of the barrier layers of the MQW light emitting layer.

3. The semiconductor light emitting element according to claim 1, wherein the n-type semiconductor layer and the super lattice structure layer are made of a GaN-based semiconductor and the first control layer is made of an InGaN-based semiconductor having an In composition greater than that of the second semiconductor layer of the super lattice structure layer.

4. The semiconductor light emitting element according to claim 3, wherein the MQW light emitting layer has an InGaN/GaN quantum well structure.

5. The semiconductor light emitting element according to claim 4, wherein when a layer thickness (Lcb) of the first control layer is larger than a layer thickness (Lb) of the barrier layers of the MQW light emitting layer (Lcb>Lb), the In composition (y1) of the first control layer is greater than an In composition (z1) of the barrier layers of the MQW light emitting layer (y1>z1).

6. The semiconductor light emitting element according to claim 3, wherein the In composition of the first control layer is 2 to 10% and a layer thickness of the first control layer is at most 10 nm.

7. The semiconductor light emitting element according to claim 4, wherein the In composition of the first control layer is 2 to 10% and a layer thickness of the first control layer is at most 10 nm.

8. The semiconductor light emitting element according to claim 5, wherein the In composition of the first control layer is 2 to 10% and the layer thickness of the first control layer is at most 10 nm.

* * * * *